US008198922B1

(12) United States Patent
Chu

(10) Patent No.: US 8,198,922 B1
(45) Date of Patent: Jun. 12, 2012

(54) PROGRAMMABLE ULTRASOUND TRANSMIT BEAMFORMER INTEGRATED CIRCUIT AND METHOD

(75) Inventor: Ching Chu, San Jose, CA (US)

(73) Assignee: Supertex, Inc., Sunnyvale, CA (US)

( * ) Notice: Subject to any disclaimer, the term of this patent is extended or adjusted under 35 U.S.C. 154(b) by 184 days.

(21) Appl. No.: 12/775,242

(22) Filed: May 6, 2010

(51) Int. Cl.
*H03K 3/00* (2006.01)

(52) U.S. Cl. ........................................................ 327/112

(58) Field of Classification Search ........................ None
See application file for complete search history.

(56) References Cited

U.S. PATENT DOCUMENTS

2003/0107987 A1* 6/2003 Kinstler ........................ 370/228
2007/0279094 A1* 12/2007 Jiang ................................ 326/83

* cited by examiner

*Primary Examiner* — Lincoln Donovan
*Assistant Examiner* — Sibin Chen
(74) *Attorney, Agent, or Firm* — Weiss & Moy, P.C.; Jeffrey D. Moy

(57) ABSTRACT

A digital switched current source is coupled to a programmable current source-driver and controlled by waveforms stored in the programmable and floating complementary sourcing and sinking current source-driver. A plurality of complementary P- and N-MOSFET is coupled to the programmable floating current source driver. The transformerless programmable ultrasound transmit beamformer integrated circuit is provided and directly coupled to the plurality of transducers.

3 Claims, 6 Drawing Sheets

PROGRAMMABLE ULTRASOUND TRANSMIT BEAMFORMER INTEGRATED CIRCUIT AND METHOD

RELATED APPLICATIONS

The present provisional application is related to U.S. patent application entitled, "Ultrasound Transmit Beamformer Integrated Circuit and Method", Filed Feb. 15, 2007, and having U.S. Ser. No. 11/675,517 in the name of Lazar A. Shifrin. This patent application further is related to U.S. Provisional Application No. 61/073,850, filed Jun. 19, 2008, entitled "PROGRAMMABLE ULTRASOUND TRANSMIT BEAMFORMER INTEGRATED CIRCUIT AND METHOD" in the name of the same inventor, and which is incorporated herein by reference in its entirety, and U.S. patent application Ser. No. 12/484,107, filed Jun. 19, 2009, entitled "PROGRAMMABLE ULTRASOUND TRANSMIT BEAMFORMER INTEGRATED CIRCUIT AND METHOD" in the name of the same inventor

FIELD OF THE INVENTION

This invention relates to a programmable ultrasound transmit beamformer waveform generator, and more particularly, to an ultrasound pulse waveform generator circuit and method with waveform and transmitting sequence control data memory for driving a piezoelectric transducer array probe for transmit beamforming and dynamic focusing.

BACKGROUND OF THE INVENTION

Ultrasound array transmitters in medical or nondestructive testing (NDT) imaging application have a growing demand for more sophisticated electrical excitation waveforms to generate well-focused, high resolution targeted, coherently formed, high frequency acoustic dynamic scanning beams. The conventional ultrasound transmit pulse generator circuits that can generate two different voltage amplitudes of bidirectional and return-to-zero pulses (such as a 5-level pulser) include at least six high-voltage high current MOSFET transistors in an output stage, such as described below in conjunction with FIG. 1. The cost per transmit channel of such pullers compared to a 2-level or 3-level pulser increases dramatically.

Therefore, a need exists to provide a device and method to overcome the above problem.

SUMMARY

In accordance with one embodiment, a digital switched current source is coupled to a programmable current source-driver and controlled by waveforms stored in the programmable and floating complementary sourcing and sinking current source-driver. A plurality of complementary P- and N-MOSFET is coupled to the programmable floating current source driver. The transformer-less programmable ultrasound transmit beamformer integrated circuit is provided and directly coupled to the plurality of transducers.

The present invention will be more apparent from the following detailed description taken in conjunction with the accompanying drawings.

DETAILED DESCRIPTION

In various embodiments, the waveform generators of the present invention provide ultrasound imaging probe transducer excitation using a large number array of high voltage and high current transmit pulse waveform generators that may be controlled by a digital logic interface directly with fast response and precise timing. Electronics controlled dynamic focus, acoustic phase-array, and transmitting beamforming technology may be used in color Doppler image portable ultrasound machines. In various embodiments, the waveform generators of the present invention provide digital controlled, programmable high voltage waveform multiple generator channels that are integrated into very small ICs. In various embodiments, the waveform generators of the present invention may generate various transmitting waveforms, and include only two high current output stage MOSFETs.

Figure 1:
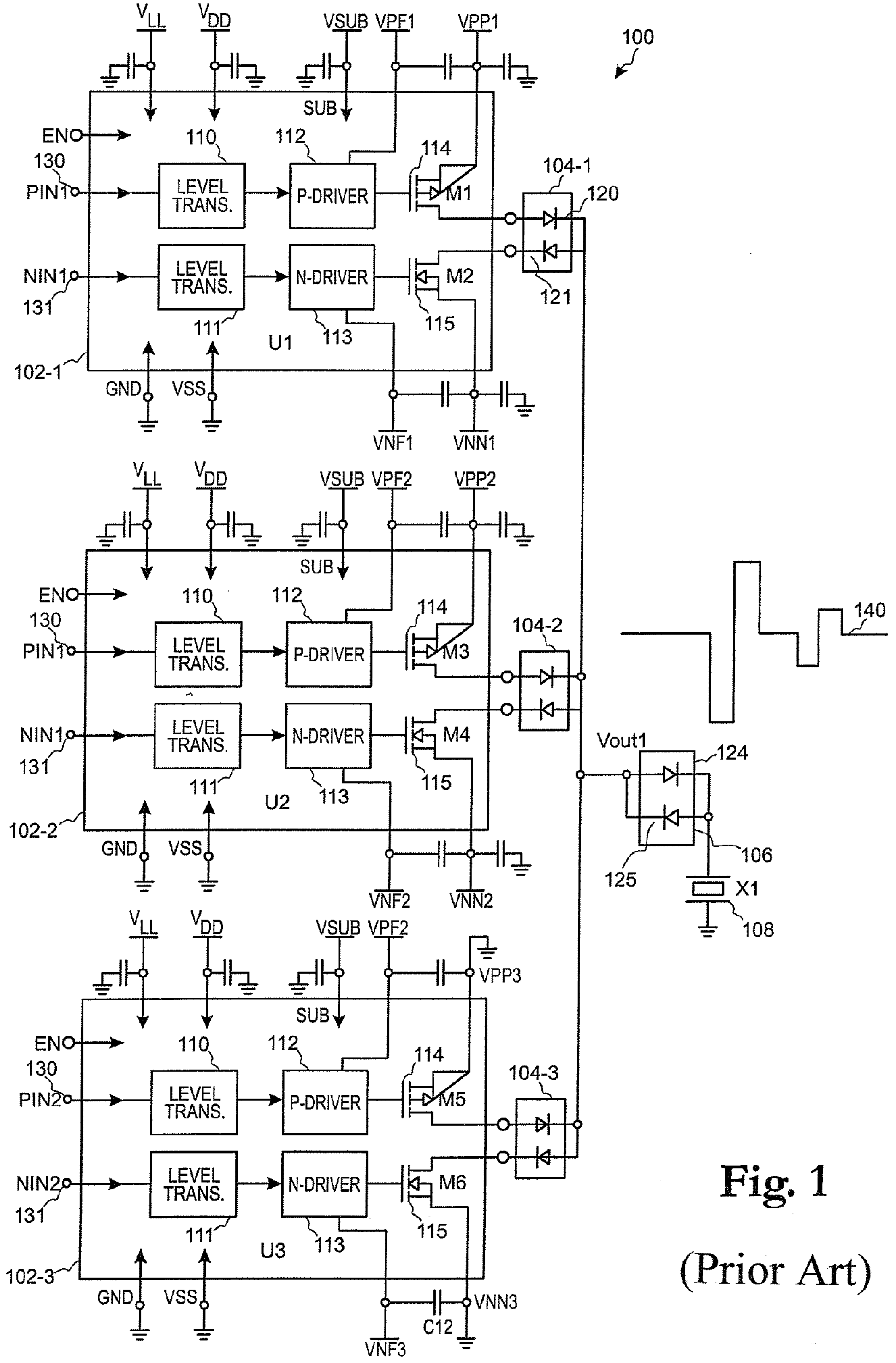
Fig. 1 (Prior Art)
FIG. 1 is a schematic diagram illustrating a conventional 5-Level high voltage pulser.

Referring to FIG. 1, a schematic diagram illustrating a conventional 5-level high voltage pulser 100 with a return-to-zero (RTZ) function is shown. The pulser 100 generates a 5-level high voltage waveform 140. In the present embodiment, the pulser 100 uses a plurality of power amplifiers 102-1 through 102-3. Each power amplifier is coupled to a corresponding diode protection circuit 104-1 through 104-3. The output of each diode protection circuit 104-1 through 104-3 is coupled to a back-to-back cross coupled diode circuit 106. The back-to-back cross coupled diode circuit 106 is further coupled to a transducer 108.

Each of the power amplifiers 102-1 through 102-3 comprises a plurality of level translators 110 and 111. Each of the level translators is coupled to one of a P—driver 112 or an N-driver 113. A PMOS transistor 114 is coupled to the P-driver 112 and an NMOS transistor 115 is coupled to the N-driver 113. For simplicity and clarity, reference numbers are shown only in the power amplifier 102-1.

Each of the diode circuit 104-1 through 104-3 comprises a plurality of diodes 120 and 121. One of the diodes 120 is coupled to the PMOS transistors. The other diode 121 is coupled to the NMOS transistor. For simplicity and clarity, reference numbers are shown only in the diode circuit 104-1.

The cross coupled diode circuit 106 comprises a plurality of diodes 124 and 125 arranged in a cross coupled configuration with the anode of the diode 124 coupled to the cathode of the diode 125 and the cathode of the diode 124 being coupled to the anode of the diode 125. In accordance with one embodiment of the present invention, the transducer 108 may be an electroactive lens, or a piezoelectric element.

In operation, the level translator 110 shifts the voltage level of an input signal 130 and provides the level shifted signal to the P-driver 112. The P-driver 112 controls the gate of the PMOS transistor 114, which is arranged in a source follower power amplifier configuration between a voltage source VPP1 and the cathode of the diode 120 of the diode protection circuit 104. The PMOS transistor 114 and the NMOS transistor 115 are driven by the directly coupled MOSFET gate drivers 112 and 113, respectively. The PMOS transistor 112 provides the amplified signal through the diode 124 of the cross-coupled diode circuit 106 to the transducer 108.

The level translator 111 shifts the voltage level of an input signal 131 and provides the level shifted signal to the N-driver 113. The N-driver 113 controls the gate of the NMOS transistor 114, which is arranged in a source follower power amplifier configuration between the anode of the diode 121 of the diode protection circuit 121 and a negative voltage source VNN1. The NMOS transistor 114 receives amplified signal through the diode 125 of the cross-coupled diode circuit 106 from the transducer 108.

Figure 2:
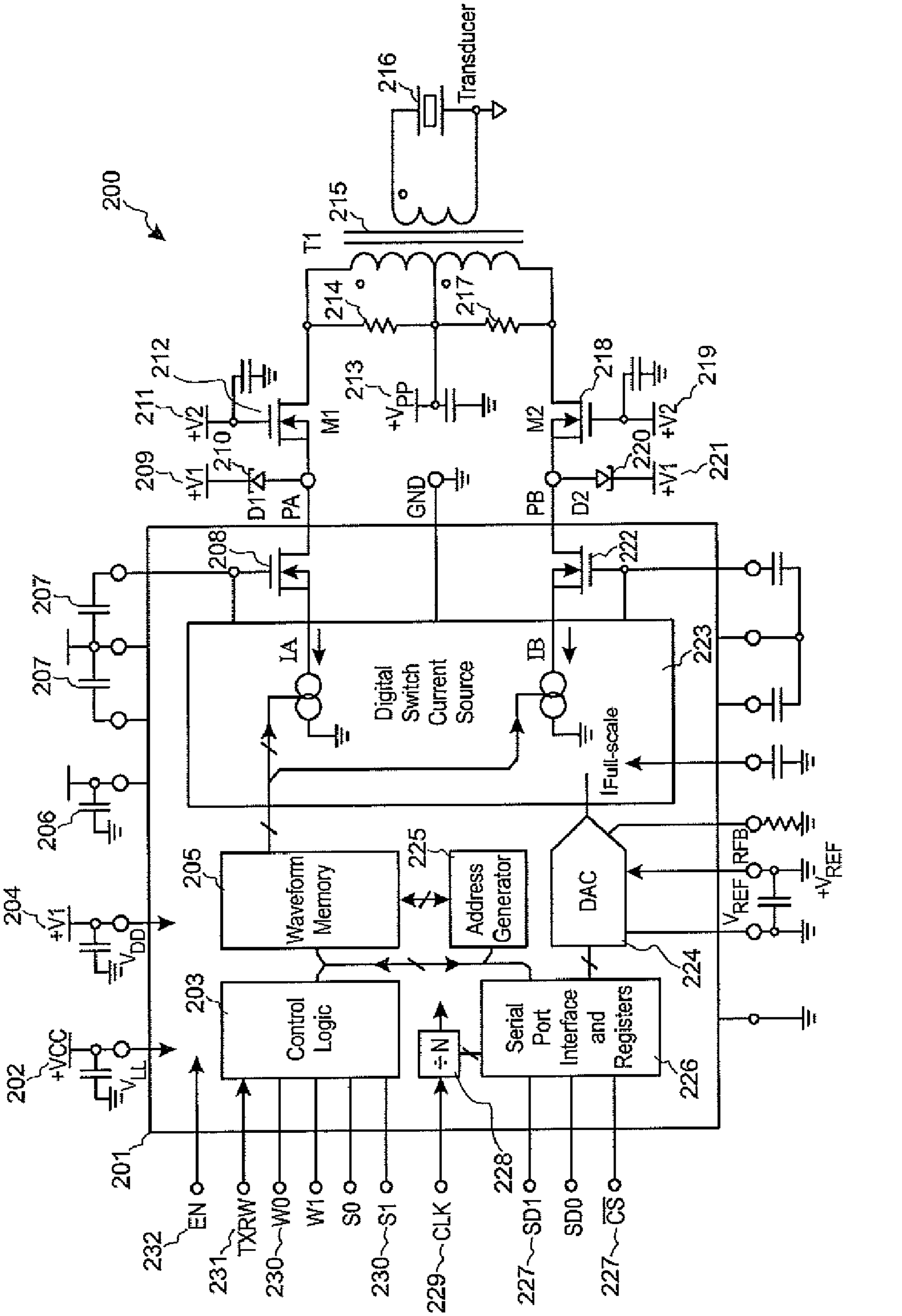
FIG. 2 is a schematic diagram illustrating a high voltage waveform generator circuit that includes a push-pull source-driving current-source pulse amplitude modulation and voltage amplifier stage for ultrasound transmit excitation applications in accordance with the present invention.

Referring now to FIG. 2, a schematic block diagram illustrating a waveform generator circuit 200 of the present invention is shown. The circuit 200 has a source-driver and control circuit 201. In accordance with the present embodiment, the source-driver and control circuit 201 may have control logic 203, waveform memory 205, address generator 225, transmitting frequency pre-scale 228, serial port interface 226, and a DAC 224.

A switching current control circuit 223 is coupled to the source-driver and control circuit 201. Two push-pull output MOSFETs circuit 208 and 222 are coupled to the switching current control circuit 223. A protection diode 210 and 220 are connected to the push-pull output MOSFETs circuit 208 and 222 respectively and to a voltage source 209 and 221 respectively which have the same or higher voltage as VDD voltage 204. The drain of each push-pull output MOSFET circuit 208 and 222 are driving the high voltage N type MOSFETs 212 and 218 source pins respectively. The gates of the high voltage N type MOSFETs 212 and 218 are grounded for AC point of view but connected to a voltage +V2 of 211 and 219 as DC bias voltage.

The bias voltage of 211 and 219 and the gate threshold have been selected such when PA and PB are off same voltage as +V1, that the high voltage N type MOSFETs 212 and 218 will be also turned off, when voltage of PA and PB are low to reasonable level the current of the high voltage N type MOSFETs 212 and 218 can be predetermined value as the maximum.

The current of the maximum to zero level may be linearly or almost linearly controlled by the digital switch current source 223 and the full-scale current DAC 224 settings. The digital current source is controlled by the waveform memory 205. The waveform memory 205 can be read and write accessed via the serial port interface 226 via the input pins 227, including serial data input, serial data output and select control etc pins.

The clock pin 229 of the circuit is shared for the serial interface and data transmitting operation. There is memory and control registers in the serial port interface 226 circuit. The memory and control registers may be used for storing all the programmable features such as setting start address on the address generator 225, length of the waveform data set, transmitting frequency pre-scale 228 (clock frequency divide-by-N) and number of repeating transmitting loops or infinite times (CW) mode, the polarity of the output swapping and time-symmetric waveform memory address fast-reverse function to save half of the waveform data points etc.

The high voltage N type MOSFETs 212 and 218 drains are connected to a center tapped RF current transformer 215. The secondary of the RF current transformer 215 is connected to the load piezoelectric or capacitive ultrasound transducer 216. The RF current transformer 215 not only serves as push-pull differential-to-single-end RF converter, but also performs the work output impedance matching component. The center tap of the RF current transform 215 is connected to the high voltage power supply 213. Two resistors 214 and 217 are parallel with the primarily of the RF current transformer 215 as the damper resistors to absorb the energy in the winding leakage inductance of the RF current transformer 215.

The DAC 224 is used for setting up the full-scale current of both digital switch control current in the digital switch current source 223. There is an external pin for the input of the DAC reference voltage +VREF. Besides the de-coupling capacitors for each of the power supply voltages, there are additional de-coupling capacitors and the by pass capacitors 206, 207 on the both side of push and pull circuits for the DAC 224 and it's reference, constant current control loop and bias circuit.

In accordance with one embodiment of the present invention, The voltage supply of the circuit +V1=+5V, +V2=VCC=+3.3V and VPP=+15V to +100V fixed power supply typically.

Figure 3:
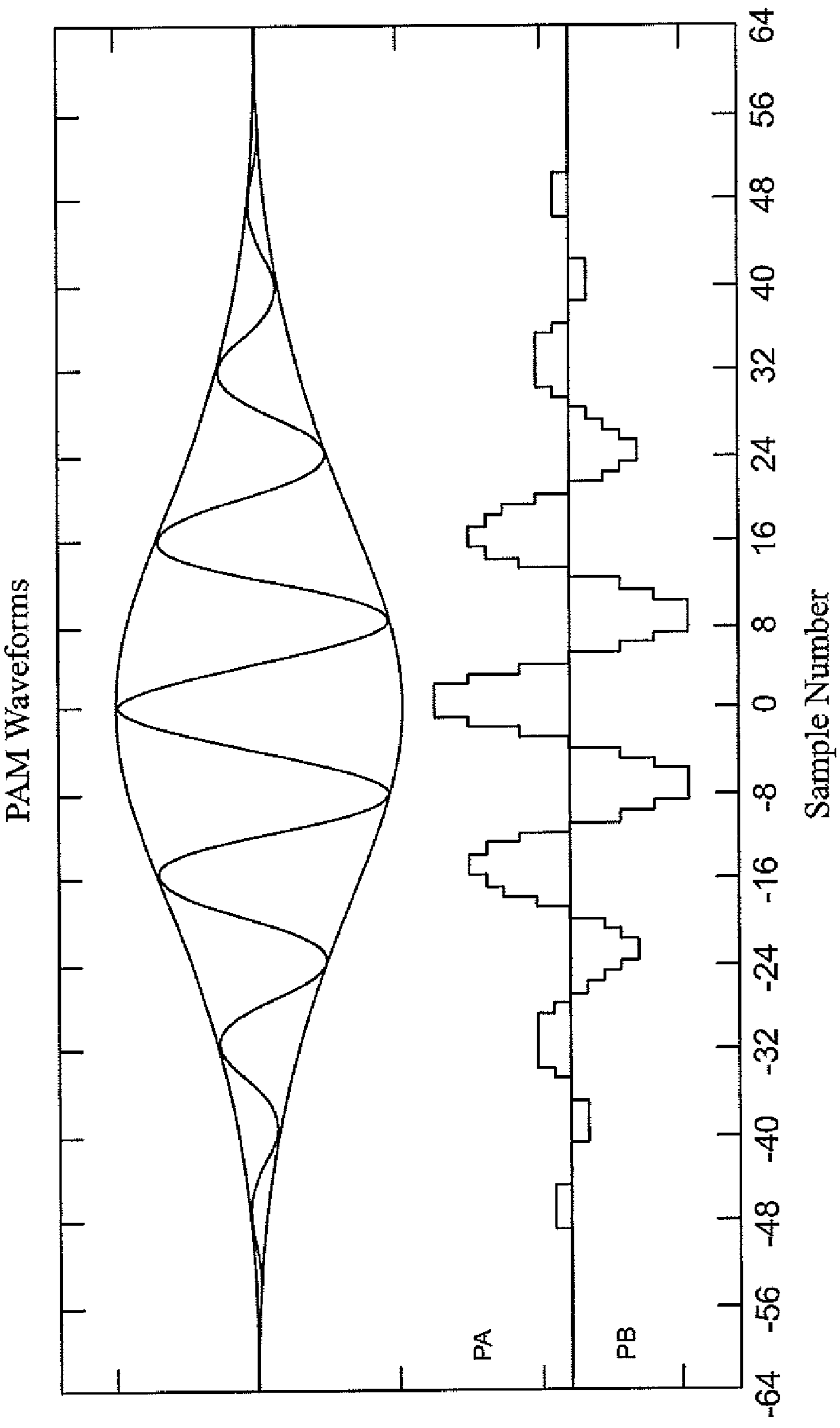
FIG. 3 is a graph showing PAM waveforms.

Referring to FIG. 3, a sample waveform of the circuit depicted in FIG. 2 is shown.

Figure 4:
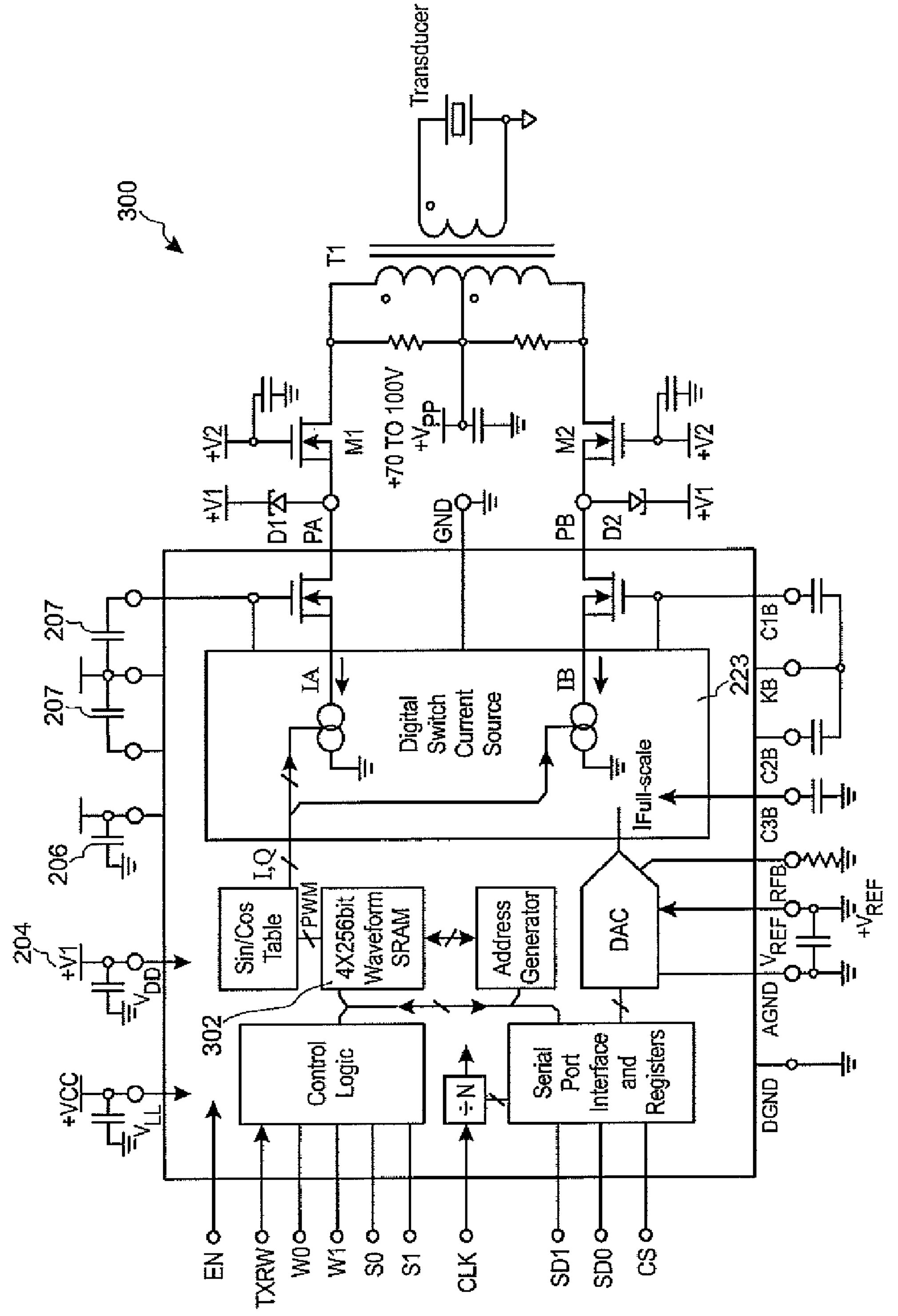
FIG. 4 is a schematic diagram illustrating a waveform generator circuit including a push-pull source-driving current-source pulse amplitude and width modulations, vector angle lookup table and voltage amplifier stage configuration in accordance with another embodiment of the present invention.

Referring to FIG. 4, another embodiment of the waveform generator circuit 300 of the present invention is shown. The waveform generator circuit 300 is a PWM version. In the present embodiment, the waveform generator 300 replaces the waveform memory 205 of FIG. 2 with a sine-cosine look-up table 303 and 4-bit width PWM control data memory 302 which is used for storing PWM waveforms.

Figure 5:
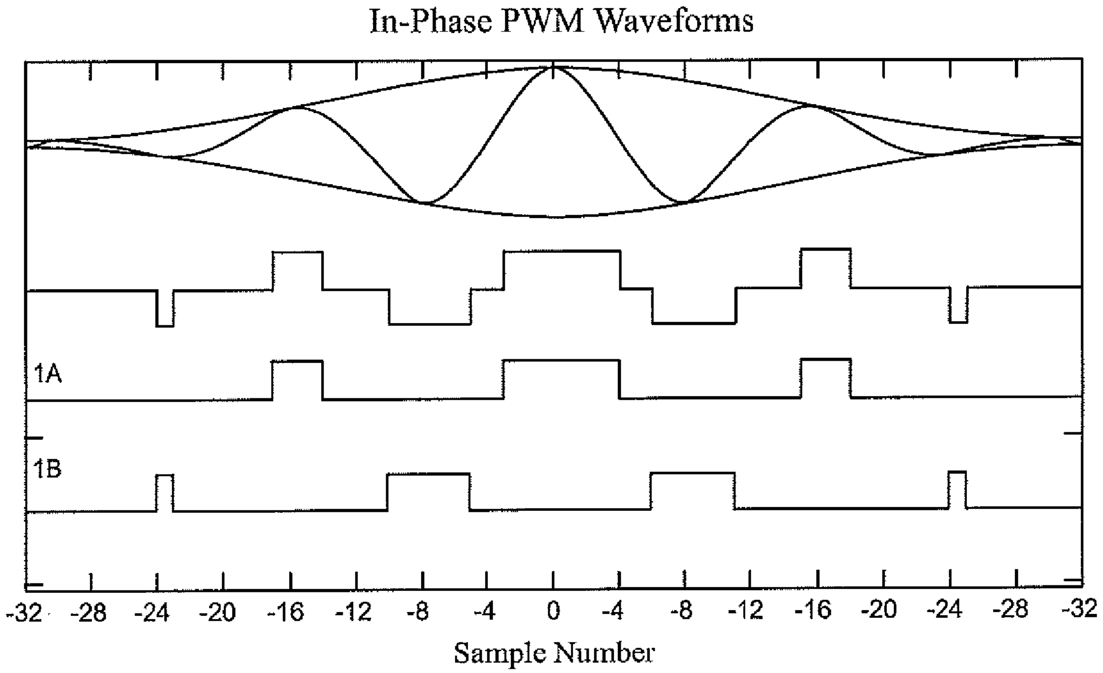
FIG. 5 is a graph showing a typical waveform of Gaussian sine wave to generated by IA, QA, IB, QB PWM signals.
Figure 5:
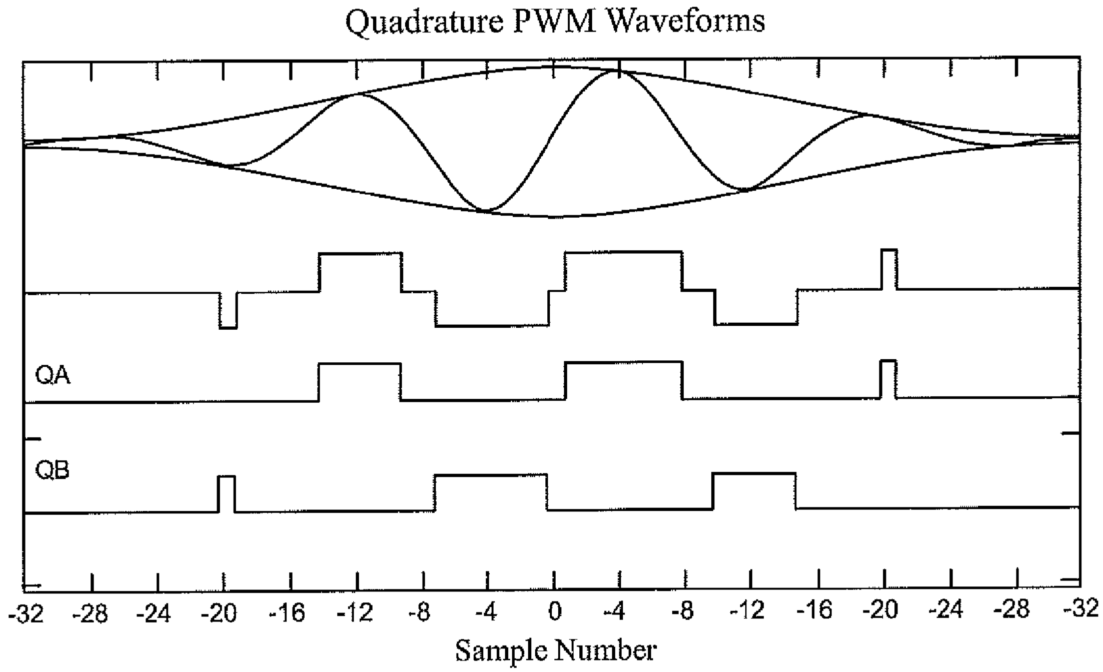

Referring to FIG. 5, the waveform that typical waveform of Gaussian sine wave to generated by IA, QA, TB, QB PWM signals is shown.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

Figure 6:
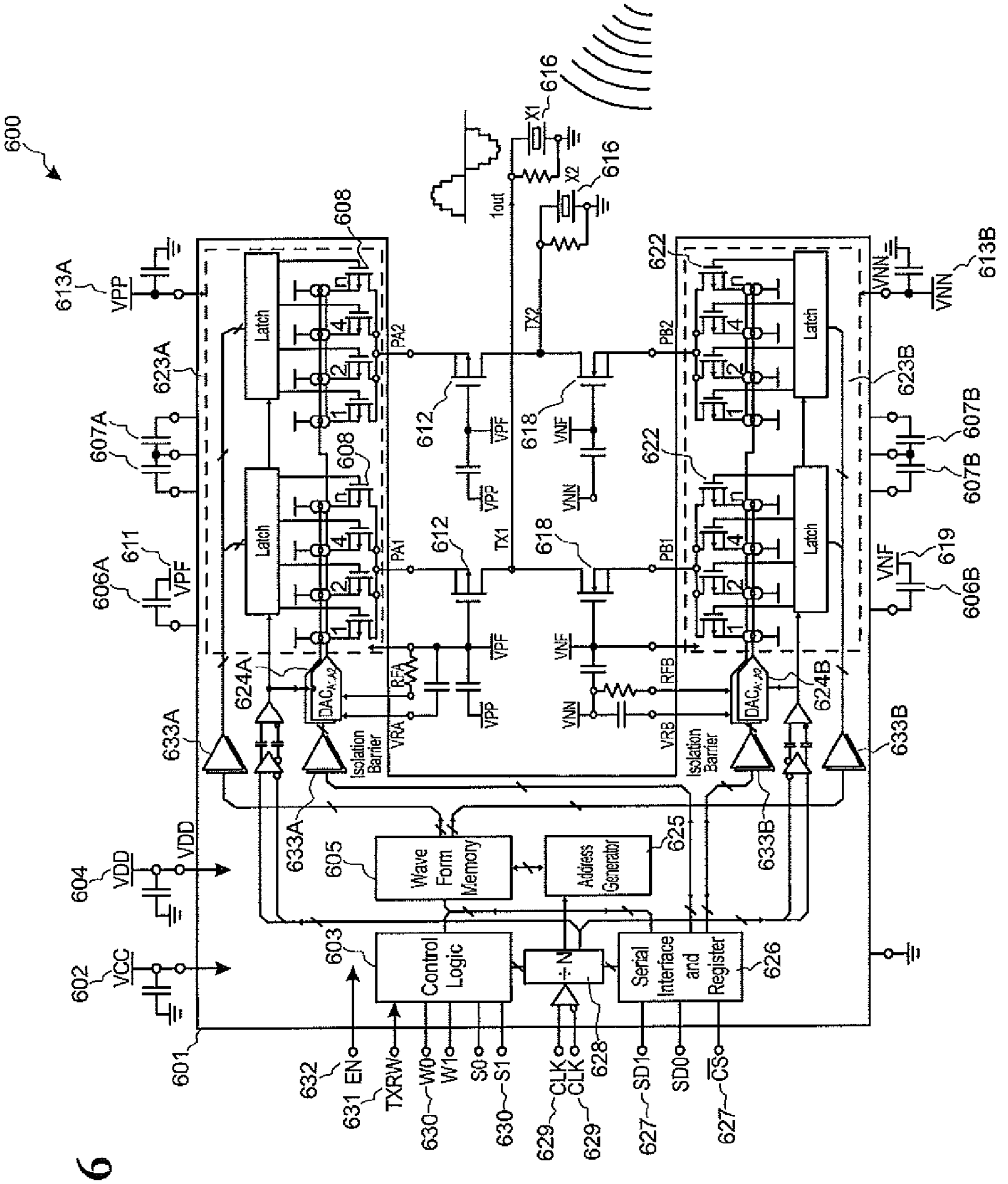
FIG. 6 is a schematic diagram illustrating a high voltage waveform generator circuit that includes a transformer-less complementary source-driving current-source pulse amplitude modulation and voltage amplifier stage for ultrasound transmit excitation applications in accordance with the present invention.

Referring now to FIG. 6, a schematic block diagram illustrating a transformer-less of waveform generator circuit 600 of the present invention is shown. The circuit 600 has a floating source-driver and control circuit 601. In accordance with the present embodiment, the source-driver and control circuit 601 may have control logic 603, waveform memory 605, address generator 625, transmitting frequency pre-scale 628, serial port interface 626, DACs 624A and 624B.

A switching current control circuit 623 is coupled to the source-driver and control circuit 601. Two P- and N-type output MOSFETs circuit 608 and 622 are coupled to the switching current control circuit 623A and 623B. The drain of each output MOSFET circuit 608 and 622 are driving the high voltage P- and N-type MOSFETs 612 and 618 source pins respectively. The gates of the high voltage P- and N-type MOSFETs 612 and 618 are grounded for AC point of view but connected to a voltage VPF of 611 and VNF of 619 respectively as DC bias voltage.

The bias voltage of 611 and 619 and the gate threshold have been selected such when PA and PB are off same voltage as VPF or VNF, that the high voltage P- or N-type MOSFETs 612 and 618 will be also turned off, when voltage of PA and PB are low or high to reasonable level the current of the high voltage P- or N-type MOSFETs 612 and 618 can be predetermined value as the maximum.

The current of the maximum to zero level may be linearly or almost linearly controlled by the digital switch current source 623 and the full-scale current DAC 624A/B settings. The digital current source is controlled by the waveform memory 605. The waveform memory 605 can be read and write accessed via the serial port interface 626 via the input pins 627, including serial data input, serial data output and select control etc pins.

The clock pin 629 of the circuit is shared for the serial interface and data transmitting operation. There is memory and control registers in the serial port interface 626 circuit. The memory and control registers may be used for storing all the programmable features such as setting start address on the address generator 225, length of the waveform data set, transmitting frequency pre-scale 628 (clock frequency divide-by-N) and number of repeating transmitting loops or infinite times (CW) mode, the polarity of the output swapping and time-symmetric waveform memory address fast-reverse function to save half of the waveform data points etc.

The high voltage P- and N-type MOSFETs 612 and 618 drains are connected together then to the load piezoelectric or capacitive ultrasound transducer 616. There is no need of a RF current transformer like 215. The high voltage power supply 613A and 613B are connected to the sourcing current programmable source circuit block 623A top, and to the sinking current programmable source circuit block 623B bottom respectively.

The DAC 624 is used for setting up the full-scale current of both digital switch control current in the digital switch current source 623A/B. There is an external pin for the input of the DAC reference voltage VRA and VRB. Besides the de-coupling capacitors for each of the power supply voltages, there are additional de-coupling capacitors and the by pass capacitors 606A/B, 607A/B on the both side of circuits for the DAC 624A/B and it's reference, constant current control loop and bias circuit.

In accordance with one embodiment of the present invention, The voltage supply of the circuit VDD=+5V, VCC=+3.3V and VPP/VNN=±15V to ±100V fixed power supplies, and (VPP-VPF)=4-5V, (VNF=VNN)=+5V floating power supplies typically.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure

What is claimed is:

1. An electrical waveform generating circuit comprising:
- a floating source-driver and control circuit;
- a pair of switching control circuits coupled to the floating source-driver and control circuit;
- a plurality of complementary P- and N-type MOSFETs coupled to the switching control circuits; and
- a transducer coupled to the complementary P- and N-type MOSFETs;
- wherein the floating source-driver and control circuit comprises:
- a frequency pre-scale unit;
- control logic coupled to the frequency pre-scale unit;
- a waveform memory coupled to the frequency pre-scale unit;
- an address generator coupled to the waveform memory and the frequency pre-scale unit; and
- a pair of digital to analog converters coupled to the waveform memory, wherein one of the pair of digital to analog converters is coupled to a switching current control circuit.

2. An electrical waveform generating circuit in accordance with claim 1, wherein the floating source-driver and control circuit further comprises a serial port interface coupled to the frequency pre-scale unit.

3. An electrical waveform generating circuit in accordance with claim 1, wherein the plurality of complementary P- and N-type MOSFETs coupled to the switching control circuits comprises:
- a pair of P-type output circuits coupled to a first of the pair of switching control circuits;
- a pair of N-type output circuits coupled to a second of the pair of switching control circuits;
- a pair of P-type MOSFETs wherein a drain terminal of each of the pair of P-type MOSFETs is coupled to the transducer; and
- a pair of N-type MOSFETs wherein a drain terminal of each of the pair of N-type MOSFETs is coupled to the transducer.

* * * * *